United States Patent [19]

Okunaka et al.

[11] Patent Number: 4,510,222
[45] Date of Patent: Apr. 9, 1985

[54] PHOTOMASK WITH CORRECTED WHITE DEFECTS

[75] Inventors: Masaaki Okunaka, Fujisawa; Katsuro Mizukoshi, Yokohama; Mikio Hongo, Yokohama; Tateoki Miyauchi, Yokohama, all of Japan

[73] Assignee: Hitachi, Ltd., Tokyo, Japan

[21] Appl. No.: 496,245

[22] Filed: May 19, 1983

[30] Foreign Application Priority Data

May 24, 1982 [JP] Japan ................................. 57-86604

[51] Int. Cl.³ .............................................. G03F 9/00
[52] U.S. Cl. ......................................... 430/5; 430/938; 430/945; 427/53.1; 427/142; 427/140
[58] Field of Search ........................... 430/5, 945, 938; 427/140, 53.1, 142

[56] References Cited

U.S. PATENT DOCUMENTS

| 4,023,961 | 5/1977 | Douglas et al. | 75/0.5 AC |
| 4,340,654 | 7/1982 | Campi | 430/5 |
| 4,444,801 | 4/1984 | Hongo et al. | 427/10 |
| 4,463,073 | 7/1984 | Miyauchi et al. | 430/5 |

FOREIGN PATENT DOCUMENTS

| 57-206026 | 12/1982 | Japan | 430/5 |
| 58-6128 | 1/1983 | Japan | 430/5 |

Primary Examiner—John Kittle
Assistant Examiner—José G. Dees
Attorney, Agent, or Firm—Antonelli, Terry & Wands

[57] ABSTRACT

A photomask with white defects that have corrected with a film comprising a mixture of silver and tantalum oxide. The film has a good resistance to chemicals.

9 Claims, 5 Drawing Figures

PHOTOMASK WITH CORRECTED WHITE DEFECTS

BACKGROUND OF THE INVENTION

1. Field of the Invention

The present invention relates to a photomask used in the production of LSI's and other integrated circuits, and in particular to a photomask with corrected white defects.

2. Brief Description of the Prior Art

According to the prior art, such as Japanese Unexamined Patent Application No. 94340/1981, white defects on photomasks have been corrected by applying a solution of a metal complex of silver and titanium to the defects, and locally irradiating only the defective area onto which the solution has been applied with a laser beam to form thereupon a mixed film of silver and titanium oxide.

This film, however, has a poor resistance to chemicals. When the photomask is washed with acid or alkali to remove attached dust and other foreign matter prior to use, the silver and titanium oxide are dissolved.

SUMMARY OF THE INVENTION

The object of the present invention is to provide a photomask with white defects that have been corrected with a film having excellent resistance to chemicals.

This object is achieved by applying a composition comprising silver nitrate, at least one compound selected from the group of tantalum complexes described by general formulas (1) to (3)

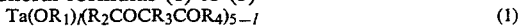
$$Ta(OR_1)_l(R_2COCR_3COR_4)_{5-l} \quad (1)$$

$$Ta(OR_1)_m(OCOR_5)_{5-m} \quad (2)$$

$$Ta(OR_1)_n(R_2COCR_3COR_4)_k(OCOR_5)_{5-n-k} \quad (3)$$

(wherein $R_1$, $R_3$ and $R_5$ are alkyl groups of 1 to 18 carbon atoms, $R_2$ and $R_4$ are alkyl or alkoxy groups of 1 to 18 carbon atoms, and l, m, n, and k are 0 or integers from 1 to 5, with $n+k \leq 5$), and a solvent to at least the white defects on the photomask, and training a laser beam locally onto the defects to cause the deposition of silver and tantalum oxide such as to form a mixed deposition film.

The materials employed in the present invention are described below. Irradiation of the silver nitrate by the laser beam causes a photochemical reaction to occur. The heat generated by absorption of the beam produces silver, which imparts light-shielding properties to the deposited film. The use of silver nitrate also provides excellent sensitivity and resolution.

The tantalum complexes represented by formulas (1) to (3) above undergo thermal decomposition under the effects of the heat generated by absorption of the laser light, giving tantalum oxide, which is present between the silver particles in the deposited film. This enhances the strength of the deposited film, its adhesion to the photomask pattern, and its resistance to chemicals, as a result of which the film does not dissolve during washing of the photomask. Use of the tantalum complexes also enables the formation of a uniform film.

The mixing ratio by mole of the silver nitrate and the tantalum complexes in formulas (1) to (3) is given by Eq. (I) below.

$$\frac{\text{(silver nitrate)}}{\text{(at least one of the tantalum complexes selected from general formulas (1) to (3))}} = \frac{1}{0.5} \text{ to } \frac{1}{5} \quad (I)$$

If the molar ratio of the tantalum complex to the silver nitrate is less than 0.5, the strength of the deposited film, and its adhesion to the photomask substrate and the photomask pattern become inadequate. A molar ratio of more than 5, however, provides only a small content of the light-shielding component silver in the deposited film, resulting in inadequate light-shielding properties.

The solvents in the invention should preferably be mixtures of the nitrile substitution product of an aliphatic hydrocarbon, such as acetonitrile or propionitrile, and either an alcohol such as methanol, ethanol, or isopropanol, or the monoalkyl ethers of ethylene glycol, such as ethylene glycol monomethyl ether or ethylene glycol monoethyl ether.

The presence of a carboxylic acid in the above composition, which comprises silver nitrate, at least one compound selected from the group of tantalum complexes described by formulas (1) to (3), and a solvent, further enhances the strength of the deposited film and its adhesion both to the photomask substrate and the photomask pattern. The reason for this appears to be that the addition of a carboxylic acid reduces the particle size of the silver grains in the tantalum oxide.

A polybasic carboxylic acid is desirable as the carboxylic acid. This may be, for example, malonic acid, methylmalonic acid, succinic acid, methylsuccinic acid, glutaric acid, adipic acid, suberic acid, azelaic acid, sebacic acid, itaconic acid, maleic acid, citraconic acid, ethylmaleic acid, or mesaconic acid. These acids may be used alone or in a mixture of two or more thereof.

The mixing ratio in moles of the silver nitrate and carboxylic acid in the composition should preferably fall within the range given in Eq. (II).

$$\frac{\text{(silver nitrate)}}{\text{(carboxylic acid)}} = \frac{1}{0.2} \text{ to } \frac{1}{3} \quad (II)$$

The composition used in the present invention can be applied by spin coating to give a uniform film. Brush coating and dipping are also suitable for application.

A beam of condensed light may be used to irradiate the desired portions of the film, but a laser beam is preferable.

DESCRIPTION OF THE PREFERRED EMBODIMENTS

The present invention is further illustrated by the following examples.

EXAMPLE 1

Figure 1:
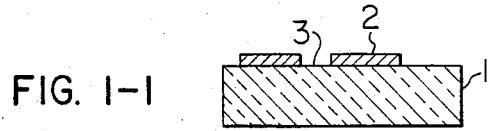
FIGS. 1—1 to 1-5 are schematic views showing the process of correcting a white defect in a photomask.
Figures 1, 2:
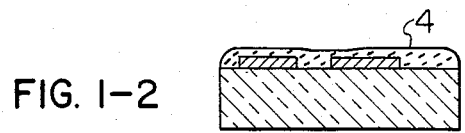

Composition Nos. 1 to 14 in the table were spin coated at 2000 rpm on the white defect 3 in the chromium pattern 2 formed on the photomask substrate (FIG. 1—1) and dried for 5 minutes at 80° C. to form film 4 shown in FIG. 1-2.

Figures 1, 2, 3:
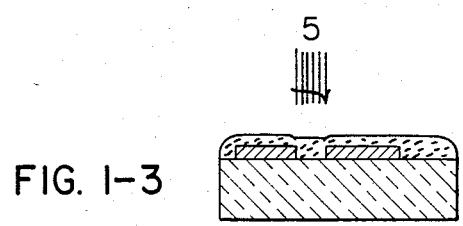
Figures 1, 2, 3, 4:
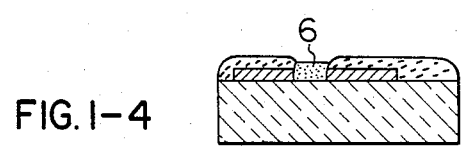
Figures 1, 2, 3, 4, 5:
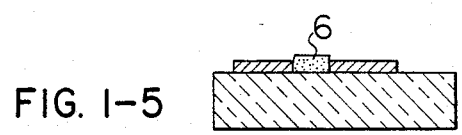

Next, as shown in FIG. 1-3, the defect was selectively irradiated for 60 seconds with an argon laser beam, causing the deposition of silver and tantalum oxide to form a light-shielding mixed deposition film (FIG. 1-4). The area irradiated with laser light was a 10-micron square on the substrate surface, and the power at the irradiated surface was 3000 W/cm.

Following this, the film remaining on the uncorrected areas of the photomask was dissolved and removed with a solvent comprising 30 parts by weight of acetonitrile and 70 parts by weight of ethylene glycol monomethyl ether, completing the correction of the white effect, as shown in FIG. 1-5.

The thickness, transmission ratio of 488-mm wavelength, light, and adhesion to the substrate of the deposited film are given in the table. In the adhesion column, the symbol stands for good, and the symbol for excellent.

It is apparent from the table that the composition in the present invention provides a deposited film that is sufficiently light-shielding and has good adhesion to the substrate. The table also shows that compositions containing a carboxylic acid have excellent adhesion to the substrate.

Next, tests were conducted to determine the alkali and acid resistances of the deposited films. The alkali resistance was determined by measuring the light transmission ratio after 30 minutes of immersion in an aqueous solution of 5% NaOH at 50° C., and comparing this with the initial value. The resistance to acid was determined by measuring the transmission ratio after 30 minutes of immersion in hot, concentrated sulfuric acid at 100° C., and comparing this with the initial value. The respective test values are given in the table. These results clearly show that the deposited films obtained from the compositions according to the present invention all have excellent resistance to alkali and acid.

TABLE

| No. | silver nitrate (parts by weight) | Liquid composition* Tantalum compound (parts by weight) | carboxylic acid (parts by weight) | film thickness (Å) | transmission ratio (%) initially | after alkali resistance test | after acid resistance test | adhesion |
|---|---|---|---|---|---|---|---|---|
| 1 | 20 (= 1 part by mole) | $Ta(OC_2H_5)_2(CH_3COCHCOCH_3)_3$, 66 (= 1 part by mole) | none | 1500 | 3 | 4 | 4 | |
| 2 | 20 (= 1 part by mole) | $Ta(OC_4H_9)(CH_3OCOCHCOCH_3)_4$, 85 (= 1 part by mole) | " | 1300 | 4 | 5 | 5 | |
| 3 | 20 (= 1 part by mole) | $Ta(OC_2H_5)(OCOC_7H_{15})_2$, 70 (= 1 part by mole) | " | 1200 | 4 | 5 | 5 | |
| 4 | 20 (= 1 part by mole) | $Ta(OC_2H_5)(CH_3COCHCOCH_3)_2$—$(OCOC_7H_{15})_2$, 82 (= 1 part by mole) | " | 1700 | 3 | 4 | 4 | |
| 5 | 20 (= 1 part by mole) | $Ta(OCH_3)(C_4H_9OCOCHCOOCH_3)$—$(OCOC_2H_5)_3$, 70 (= 1 part by mole) | " | 1700 | 3 | 4 | 4 | |
| 6 | 20 (= 1 part by mole) | $Ta(OC_2H_5)_2(CH_3COCHCOCH_3)_3$, 66 (= 1 part by mole) | propionic acid, 4.3 (= 0.5 part by mole) | 1700 | 3 | 3 | 3 | |
| 7 | 20 (= 1 part by mole) | $Ta(OC_2H_5)_2(CH_3COCHCOCH_3)_3$, 66 (= 1 part by mole) | succinic acid 6.9 (= 0.5 part by mole) | 1900 | 3 | 3 | 3 | |
| 8 | 20 (= 1 part by mole) | $Ta(OC_2H_5)_2(CH_3COCHCOCH_3)_3$, 66 (= 1 part by mole) | α-hydroxyacetic acid 6.0 (= 0.5 part by mole) | 1900 | 3 | 3 | 3 | |
| 9 | 20 (= 1 part by mole) | $Ta(OC_2H_5)_2(CH_3COCHCOCH_3)_3$, 66 (= 1 part by mole) | citraconic acid, 7.5 (= 0.5 part by mole) | 2000 | 2 | 2 | 2 | |
| 10 | 20 (= 1 part by mole) | $Ta(OC_2H_5)_2(CH_3COCHCOCH_3)_3$, 66 (= 1 part by mole) | 15 (= 1 part by mole) | 2300 | 2 | 2 | 2 | |
| 11 | 20 (= 1 part by mole) | $Ta(OC_2H_5)_2(CH_3COCHCOCH_3)_3$, 40 (= 1 part by mole) | none | 1100 | 3 | 4 | 4 | |
| 12 | 20 (= 1 part by mole) | $Ta(OC_2H_5)_2(CH_3COCHCOCH_3)_3$, 100 (= 1 part by mole) | " | 2400 | 3 | 4 | 4 | |
| 13 | 20 (= 1 part by mole) | $TaCl(OC_2H_5)_2(CH_3COCHCOCH_3)_2$, 58 (= 1 part by mole) | " | 1000 | 4 | 5 | 5 | |
| 14 | 20 (= 1 part by mole) | $TaCl(OC_4H_9)_2(C_3H_7COCHCOOC_2H_5)$, 64 (= 1 part by mole) | " | 900 | 4 | 5 | 5 | |

*solvent consists of acetonitrile (30 parts by weight) + ethylene glycol monomethyl ether (70 parts by weight)

EXAMPLE 2

20 g of Silver nitrate, 66 g of $Ta(OC_2H_5)_2$—$(CH_3COCHCOCH_3)_3$, 10 g of citraconic acid, 30 g of acetonitrile, and 70 g of methyl cellulose were mixed to form a solution. This solution was spin coated onto a photomask substrate at 2000 rpm, then dried for 10 minutes at 60° C. The photomask defects were then irradiated with a beam of condensed visible light. The beam intensity at the substrate surface was set at 1000 W/cm² and the diameter of the condensed beam at 5 microns. A light-shielding film was deposited in the irradiated area after 100 seconds of irradiation.

The deposited film had a thickness of 1500 Å and a transmission ratio for 488-mm wavelength light of 3%. Adhesion of the film to the photomask substrate was excellent.

The light transmission ratios following the same alkali and acid-resistance tests conducted in cases 1 to 14 in Example 1 were respectively 3.5% and 4%, indicating sufficient resistance for practical purposes.

What is claimed is:

1. A photomask with corrected white defects which comprises the white defects having been coated with a film comprising a mixture of silver and tantalum oxide to form a light-shielding film for the white defects which is sufficiently resistant to chemicals such that the photomask can be washed without dissolution of said film and which exhibits good adhesion to the photomask substrate.

2. A photomask with corrected white defects according to claim 1 wherein the film comprising a mixture of silver and tantalum oxide is obtained by applying a composition composed of
   (a) silver nitrate,
   (b) at least one compound selected from the group of tantalum complexes described by general formulas (1) to (3)

$$Ta(OR_1)_l(R_2COCR_3COR_4)_{5-l} \quad (1)$$

$$Ta(OR_1)_m(OCOR_5)_{5-m} \quad (2)$$

$$Ta(OR_1)_n(R_2COCR_3COR_4)_k(OCOR_5)_{5-n-k} \quad (3)$$

where $R_1$, $R_3$, and $R_5$ are alkyl groups of 1 to 18 carbon atoms, $R_2$ and $R_4$ are alkyl or alkoxy groups of 1 to 18 carbon atoms, and l, m, n, and k are 0 or integers from 1 to 5, with $n+k \leq 5$, and
   (c) a solvent, said components (a) and (b) being combined in a mixing ratio by mole falling with the range described in Eq. (I) below $$\frac{\text{(silver nitrate)}}{\text{(at least one of the tantalum complexes selected from general formulas (1) to (3))}} = \frac{1}{0.5} \text{ to } \frac{1}{5} \quad (I)$$

to at least the white defects of a photomask pattern, and irradiating the defects with a beam of light, thereby bringing about deposition of the silver and tantalum oxide.

3. A photomask with corrected white defects according to claim 2 wherein a multibasic carboxylic acid is also added to the composition.

4. A photomask with corrected white defects according to claim 2 or 3 wherein the solvent is a mixture of the nitrile substitution product of an aliphatic hydrocarbon and either an alcohol or the monoalkyl ether of an ethylene glycol.

5. A photomask with corrected white defects according to claim 3 wherein the carboxylic acid is at least one compound selected from the group consisting of malonic acid, methylmalonic acid, succinic acid, methylsuccinic acid, glutaric acid, adipic acid, suberic acid, azelaic acid, sebacic acid, itaconic acid, maleic acid, citraconic acid, ethylmaleic acid, and mesaconic acid.

6. A photomask with corrected white defects according to claim 2 wherein said beam of light is a laser beam.

7. A photomask with corrected white defects according to claim 2 wherein said composition is applied to at least the white defects by spin coating the composition on the photomask to provide a uniform film.

8. A photomask with corrected white defects according to claim 3 wherein said silver nitrate and said multibasic carboxylic acid are used in a mixing ratio, in moles, of:

$$\frac{\text{(silver nitrate)}}{\text{(carboxylic acid)}} = \frac{1}{0.2} \text{ to } \frac{1}{3}.$$

9. A photomask with corrected white defects according to claim 4 wherein said alcohol is selected from the group consisting of methanol, ethanol and isopropanol; the monoalkyl ether of ethylene glycol is selected from the group consisting of ethylene glycol monomethyl ether and ethylene glycol monoethyl ether; and said nitrile substitution product of an aliphatic hydrocarbon is selected from the group consisting of acetonitrile and propionitrile.

* * * * *